(12) United States Patent
Stevens (10) Patent No.: US 12,107,560 B2
(45) Date of Patent: Oct. 1, 2024

(54) VALVE AMPLIFIERS

(71) Applicant: Blackstar Amplification Ltd., Northampton (GB)

(72) Inventor: Paul James Stevens, Northampton (GB)

(73) Assignee: Blackstar Amplification Ltd., Northampton (GB)

(*) Notice: Subject to any disclaimer, the term of this patent is extended or adjusted under 35 U.S.C. 154(b) by 112 days.

(21) Appl. No.: 17/825,544

(22) Filed: May 26, 2022

(65) Prior Publication Data

US 2022/0385253 A1 Dec. 1, 2022

(30) Foreign Application Priority Data

May 28, 2021 (GB) .................................... 2107724

(51) Int. Cl.
| | | |
|---|---|---|
| *H03G 3/00* | (2006.01) | |
| *G10H 1/06* | (2006.01) | |
| *H03F 3/185* | (2006.01) | |
| *H03F 3/28* | (2006.01) | |
| *H03F 5/00* | (2006.01) | |

(52) U.S. Cl.
CPC ............... *H03G 3/004* (2013.01); *G10H 1/06* (2013.01); *H03F 3/1855* (2013.01); *H03F 3/28* (2013.01); *H03F 5/00* (2013.01); *G10H 2210/311* (2013.01)

(58) Field of Classification Search
CPC .... H03G 3/004; G10H 1/06; G10H 2210/311; H03F 3/1855; H03F 3/28; H03F 5/00
See application file for complete search history.

(56) References Cited

U.S. PATENT DOCUMENTS

| | | | |
|---|---|---|---|
| 5,635,872 | A | 6/1997 | Zimmerman |
| 5,761,317 | A | 6/1998 | Pritchard |
| 5,909,145 | A | 6/1999 | Zimmerman |
| 7,417,502 | B1 | 8/2008 | Cochrane |

(Continued)

FOREIGN PATENT DOCUMENTS

| | | |
|---|---|---|
| GB | 2446614 B | 8/2008 |
| WO | 2011/087957 A1 | 7/2017 |

OTHER PUBLICATIONS

Extended Search Reportdated Feb. 2, 2023, for European patent application No. EP22175766.9.

(Continued)

*Primary Examiner* — Andrew Sniezek
(74) *Attorney, Agent, or Firm* — Withrow + Terranova, PLLC; Vincent K. Gustafson (57) ABSTRACT

Multiple example valve amplifiers are provided. A first example valve amplifier is provided which comprises (i) a valve power amplifier switchable between a high-power mode and a low-power mode and (ii) a loudspeaker simulator circuit, the valve amplifier being configured such that the valve power amplifier drives the loudspeaker simulator circuit in the low-power mode. A second example valve amplifier is provided which comprises a switched-mode power supply, SMPS, system), the SMPS system comprising (i) an SMPS and (ii) circuitry configured to enable an output impedance of the SMPS to be switched between first and second output impedances, the first output impedance being lower than the second output impedance.

17 Claims, 3 Drawing Sheets

(56) References Cited

U.S. PATENT DOCUMENTS

| | | |
|---|---|---|
| 9,203,365 B1 | 12/2015 | Milbert et al. |
| 9,917,560 B1 * | 3/2018 | Smith |
| 10,110,177 B1 * | 10/2018 | Koroglu .................... H03F 3/21 |
| 2003/0169106 A1 | 9/2003 | Smith |
| 2008/0048774 A1 * | 2/2008 | Chang .................. H03F 1/0277 |
| | | 330/297 |
| 2013/0022210 A1 | 1/2013 | Vainiala |
| 2013/0136278 A1 | 5/2013 | Quilter |
| 2020/0153392 A1 | 5/2020 | Miyoshi |

OTHER PUBLICATIONS

JAD Spark OX Amp Top Box, brochure, Universal Audio. downloaded May 19, 2022 from URL https://www.uaudio.com/hardware/ox.html.

Combined search and examination report, British Patent Application No. 2107724.3 dated Nov. 26, 2021.

Corrected Search Report under Section 17 for United Kingdom Patent Application No. GB2316446.0, mailed Apr. 10, 2024, 2 pages.

* cited by examiner

VALVE AMPLIFIERS

CROSS-REFERENCE TO RELATED APPLICATIONS

Priority is claimed from British Patent Application No. 2107724.3, filed May 28, 2021 and incorporated herein by reference in its entirety.

STATEMENT REGARDING FEDERALLY SPONSORED RESEARCH OR DEVELOPMENT

Not Applicable.

NAMES OF THE PARTIES TO A JOINT RESEARCH AGREEMENT

Not Applicable.

FIELD

The present disclosure relates to valve amplifiers. The valve amplifiers may be for musical instruments, such as electric guitars.

BACKGROUND

Existing valve amplifiers that operate at relatively low power levels, for example 2 Watts (W) or 5 W, are generally relatively lightweight, physically compact, and portable. Existing valve amplifiers that operate at relatively high power levels, for example, 50 W, are generally relatively heavy, physically large, and less portable.

SUMMARY

According to first embodiments, there is provided a valve amplifier comprising:
a valve power amplifier switchable between a high-power mode and a low-power mode; and
a loudspeaker simulator circuit,
wherein the valve amplifier is configured such that the valve power amplifier drives the loudspeaker simulator circuit in the low-power mode.

According to second embodiments, there is provided a valve amplifier comprising a switched-mode power supply, SMPS, system, the SMPS system comprising:
an SMPS; and
circuitry configured to enable an output impedance of the SMPS to be switched between first and second output impedances, the first output impedance being lower than the second output impedance.

BRIEF DESCRIPTION OF THE DRAWINGS

Various embodiments will now be described, by way of example only, with reference to the accompanying drawings in which.

DETAILED DESCRIPTION

Examples described herein provide relatively lightweight, physically compact, and portable valve amplifiers that can operate at relatively high power levels, for example, 50 W. Such amplifiers still provide the high-quality valve sound often sought by guitarists.

The term "valve amplifier" is used herein to mean an amplifier with at least one thermionic valve (also known as a "valve" or "tube"). In examples described herein, the amplifier is an audio amplifier, in that it amplifies an audio signal.

Figure 1:
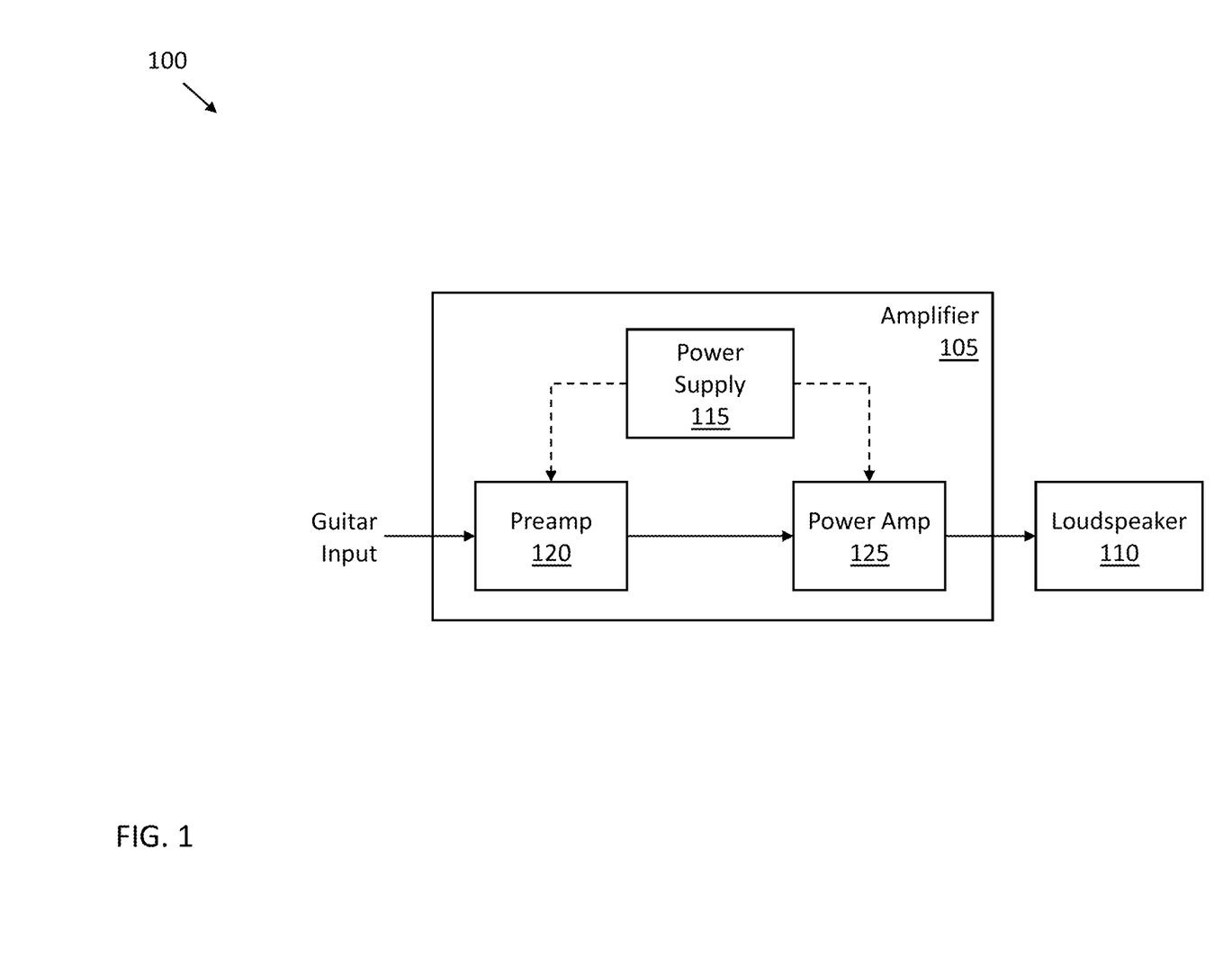
FIG. 1 shows a block diagram of an example of a system.

Referring to FIG. 1, there is shown an example of a system 100.

The system 100 comprises an amplifier 105 and a loudspeaker 110 (also known as a "speaker"). The amplifier 105 may be in a head unit (also known as a "head") and the speaker 110 may be an external speaker in a separate cabinet unit (also known as a "cabinet" or "cab"). In such a head-and-cab system, the amplifier 105 and the external speaker 110 are in different housings. Alternatively, the amplifier 105 and speaker 110 may be in the same housing as each other in a combination amplifier (also known as a "combo amp" or "combo"). In practice, the term "amp" or "amplifier" may be used informally to refer to both head-and-cab and combo systems.

The amplifier 105 comprises a power supply 115, a preamplifier 120 (also known as a "preamp") and a power amplifier (also known as a "power amp") 125. A preamp is primarily a voltage amplifier. A power amp delivers power to the speaker 110. A power amp with at least one thermionic valve may be referred to as a "valve power amp".

The power supply 115 powers the preamp 120 and the power amp 125, as shown using broken lines in FIG. 1. The power supply 115 may be a mains power supply, in which case the amplifier 105 may be said to be mains-powered.

In this example, the amplifier 105 is an electric guitar amplifier and, as such, receives an input signal from an electric guitar. The amplifier 105 may receive the guitar input via an input jack, for example. In terms of the guitar signal path (shown in solid lines in FIG. 1), a guitar signal is received by the preamp 120 and then by the power amp 125, which then drives the loudspeaker 110. The guitar signal path does not include the power supply 115.

One type of power supply is a linear power supply, which comprises a transformer and a rectifier. A linear power supply may receive AC power from the mains, transform the received AC power using the transformer, and then convert the transformed AC power to DC power using the rectifier. Transformers in linear power supply are relatively large and heavy.

Some linear power supplies use a valve rectifier (also known as a "tube rectifier") and others use a solid-state rectifier. Valve rectifiers use valves to rectify AC power, whereas solid-state rectifiers use silicon diodes. Solid-state rectifiers are far smaller and less expensive than valve rectifiers. A solid-state rectifier also converts AC power to DC power more efficiently than a valve rectifier. When a valve-rectified amplifier receives a strong input signal from an electric guitar (for example when the guitarist plays the guitar heavily), the valve rectifier experiences a voltage drop for a short amount of time. This variation in voltage introduces dynamic compression characteristics known as "sag" or "power supply sag". A solid-state rectifier experiences less of a voltage drop in response to a strong input signal and, hence, less sag than a valve rectifier. The lower sag associated with a solid-state rectifier may suit some guitarists, for example who play metal or use a fast-picked guitar playing technique. However, guitarists playing other styles, such as blues and rock, may prefer the sag that traditionally comes with a valve rectifier.

As such, even though the power supply 115 is not in the guitar signal path, it nevertheless influences the sound of the amplifier 105.

A solid-state-rectified amplifier can still comprise valves in the preamp and/or the power amp. A solid-state-rectified amplifier will still experience some sag, but this will be less pronounced than in a valve-rectified amplifier.

Figure 2:
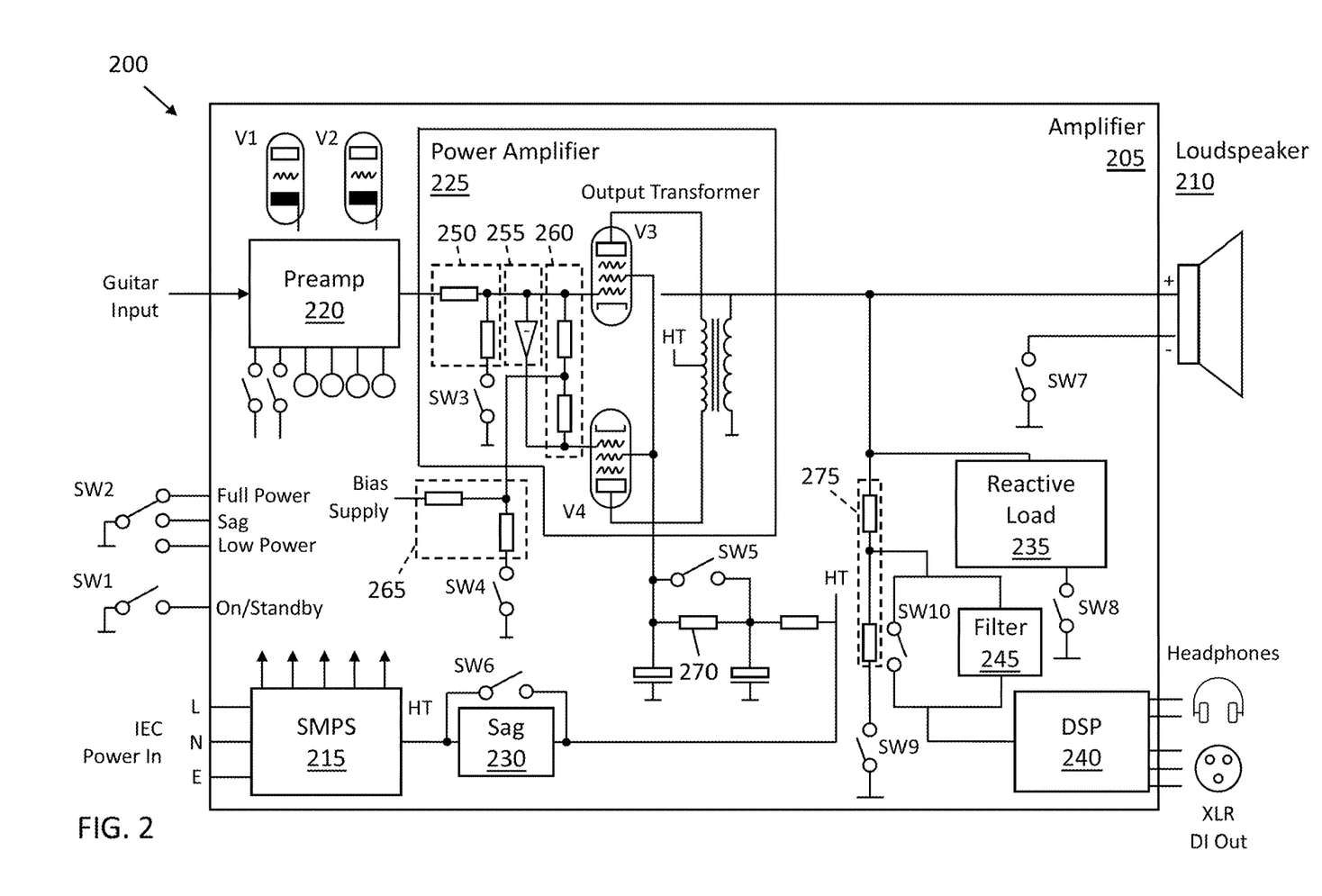
FIG. 2 shows an electrical schematic of the example system shown in FIG. 1.

Referring to FIG. 2, there is shown another example of a system 200. Some of the components of the system 200 correspond generally to components of the system 100 described above with reference to FIG. 1. Such components have the same reference numerals, but incremented by 100.

The system 200 provides a lightweight, physically compact and portable valve amplifier 205 that can be driven at a relatively high power, for example, 50 W, to provide the valve sound often sought by guitarists. For example, the amplifier 205 may be configured such that its weight is less than half that of known 50 W valve amplifiers. For example, in an example head-and-cab configuration in accordance with the present disclosure, a head unit (comprising the amplifier 205) may weigh around just 6.7 kg and may be used with a vertical 2×12" cabinet (comprising two 12" speakers 210) having a weight of around just 13.5 kg. In contrast, some known 50 W head units weigh over 8 kg and, in some cases, over 20 kg. In an example combo configuration in accordance with the present disclosure, a 50 W, 1×12" combo amp (having one 12" speaker 210) may weigh around just 12.8 kg. In contrast, some known 50 W combo amps weigh over 18 kg and, in some cases, over 25 kg.

In some examples, the speaker 210 and the speaker cabinet are lightweight components.

For example, the speaker 210 may be a Celestion Zephyr lightweight ferrite 8-Ohm (Ω), 70 W speaker. The speaker 210 may have a modified ferrite magnet structure having a geometry that enables the speaker 210 to have a sensitivity of at least 98 decibels (dB) (1 W at 1 m) while having less than 80% of the mass of an unmodified loudspeaker having the same sensitivity. The expression "1 W at 1 m" means measured at 1 metre (m) for a 1 W input.

The speaker 210 may be housed in a cabinet made of material, for example wood-based, having a density of less than approximately 680 kilograms per cubic metre (kg/m$^3$). Such a density is lower than that of chipboard, birch plywood and medium-density fibreboard (MDF), having approximate densities of 680 kg/m$^3$, 700 kg/m$^3$ and 730 kg/m$^3$ respectively. In some examples, the material has a density of at most approximately 400 kg/m$^3$. In some examples, the material has a density of at most approximately 320 kg/m$^3$. Examples of wood-based materials having densities of less than approximately 680 kg/m$^3$ include, but are not limited to, balsa plywood, paulownia wood, candlenut plywood and Malacca wood, having approximate densities of 200 kg/m$^3$, 300 kg/m$^3$, 320 kg/m$^3$ and 400 kg/m$^3$ respectively. Candlenut plywood, for example, is strong, lightweight and can have beneficial acoustic proprieties. The cabinet may be open-back or closed-back. The cabinet may have 4Ω and 16Ω outputs. The cabinet may accentuate frequencies in the region of 300 Hz to 5 kHz. The amplifier 205 may comprise an electronic cabinet filter configured to compensate for the accentuated frequencies.

In this example, the amplifier 205 has a control panel with various controls.

In this example, the control panel comprises an on/standby switch SW1 via which the speaker 210 can be switched between on and standby. The on/standby switch SW1 will be described in more detail below.

In this example, the control panel comprises a mode selection switch SW2 via which the amplifier 205 can be switched between different operating modes. In this example, the amplifier 205 is operable in three different operating modes. However, the amplifier 205 may be operable in a different number of modes in other examples. In this example, the amplifier 205 is operable in a high-power mode, a sag mode and a low-power mode. In particular, in this example, the power amp 225 is switchable between (at least) the high-power mode and the low-power mode. In this example, the high-power mode is a 50 W mode and the low-power mode is a 2 W mode. However, one or both of these power values may be different in other examples. For example, the low-power mode may be a 5 W mode. In the sag mode, which will be described in more detail below, the amplifier 205 generates more power supply sag to accentuate compression, giving a softer and more vintage feel. The user can therefore readily select high-power, sag, or low-power via the mode selection switch SW2 to achieve their desired balance of power and response for any performance situation. For example, the user can use the mode selection switch SW2 to switch down from the 50 W high-power mode for the loudest clean headroom, to the 2 W low-power mode for practicing, recording or smaller performances, or a more overdriven power amplifier tone. In particular, in this example, the speaker 210 can be driven by the power amp 225 in both the 50 W high-power mode and the 2 W low-power mode. In this example, the switches SW3, SW4 and SW5 in the amplifier 205 are all switched together to select either the high-power mode or the low-power mode.

The control panel may comprise other controls, such as master volume, tone, digital reverb, etc. In this regard, FIG. 2 shows various switches and controls for tone shaping in connection with the preamp 220, which may be provided on the control panel.

In this example, the preamp 220 comprises two valves V1, V2. Examples of such valves include, but are not limited to, ECC83 valves.

In this example, the power amp 225 comprises two valves V3, V4. The valves V3, V4 in the power amp 225 may be known as "power valves". Examples of such valves include, but are not limited to, EL34 valves and 6L6 valves.

In this example, the amplifier 205 is powered by a switched-mode power supply (SMPS) 215. The SMPS 215 may be a universal power supply, which can be used anywhere in the world from 90 Volts (V) to 264V 50/60 Hertz (Hz). An SMPS is smaller and lighter than a linear power supply, since the transformer in an SMPS is smaller and lighter than the transformer in a linear power supply. However, whereas a linear power supply can use a valve rectifier, an SMPS uses solid-state switches to transfer power from an AC source, such as the mains, to a DC load. The solid-state switches give an SMPS a faster response than a valve-rectified linear power supply and, hence, less sag.

In this example, the amplifier 205 comprises circuitry 230 configured to mimic one or more output impedance characteristics of a linear power supply and valve rectifier. In this example, the circuitry 230 comprises a sag resistor 230. The sag resistor 230 is arranged in series with an output of the SMPS 215. The sag resistor 230 emulates the sag of a valve rectifier, even though the power supply is an SMPS 215. The sag resistor 230 may have a resistance of at least 100Ω. The sag resistor 230 may have a resistance of at most 470Ω. Example resistance values of the sag resistor are 100Ω and 470Ω. However, other resistances between, or outside, these values may be used in other examples. In this example, a switch SW6 is arranged in parallel with the sag resistor 230. The switch SW6 is controlled to be in a closed state or an open state. When the switch SW6 is in the closed state, the power supply is 'stiff'. When the switch SW6 is in the open state, sag is added. The amplifier 205 is therefore configured such that the sag resistor 230 can, selectively, be used to add sag or not to add sag. As such, circuitry, namely SW6, is configured to enable an output impedance of the SMPS 215 to be switched between first and second output impedances, the first output impedance being lower than the second output impedance. The sag resistor 230 is physically small and lightweight and its impact on overall weight is negligible. In particular, the size and weight of the SMPS 215 and sag resistor 230 is less than that of a comparable linear power supply with a valve rectifier.

In some examples, the sag resistor 230 is only used when the amplifier 205 is in the high-power mode. In particular, the sag resistor 230 relies on a high current to be effective, which, in examples, is available in the higher-power mode but not in the low-power mode. In some examples, the switch SW6 is automatically closed when the amplifier 205 is switched down to the low-power mode.

The term "SMPS system" is used herein to denote a system comprising an SMPS and may be used herein to denote the SMPS 215, circuitry 230 and switch SW6 collectively.

In this example, the amplifier 205 also comprises a built-in (or "internal") load 235. In this example, the load 235 is a loudspeaker simulator circuit, which is generally referred to herein as a "dummy load". A dummy load simulates an electrical load. In this example, the dummy load simulates a speaker and mimics the electrical response of a typical speaker. The dummy load 235 allows the valves V1, V2, V3, V4 to be driven without the speaker 210 being connected. As such, the amplifier 205 can operate substantially silently using the dummy load 235.

As explained above, the speaker 210 can be switched between 'on' and 'standby' using the control panel switch SW1. When the control panel switch SW1 is set to 'on', the speaker 210 is connected. When the control panel switch SW1 is set to 'standby', the dummy load 235 is connected. As such, a set of switches implement switching between the power amp 225 driving the dummy load 235 in a first output mode (namely a silent output mode) and the power amp 225 driving the speaker 210 in a second output mode (namely a non-silent output mode). In this example, the set of switches includes switches SW1, SW7 and SW8.

In this example, the dummy load 235 is a reactive load. A reactive load better represents the electrical response of a typical speaker than a purely resistive load. A purely resistive load does not accurately simulate the inductive and capacitive characteristics of a speaker. The reactive load 235 therefore allows authentic valve power amplifier tones to be delivered without the speaker 210 being driven.

When connected, the dummy load 235 dissipates power that would, ordinarily, drive the speaker 210. The size and weight of a dummy load, whether reactive or purely resistive, increases as the amount of power to be dissipated by the dummy load increases. For example, the size and weight of a dummy load needed to dissipate 50 W of power is significantly greater than that needed to dissipate 2 W of power. Some known dummy loads that can dissipate powers of 50 W and above weigh at least 1 kg and may weigh over 6 kg. In contrast, a dummy load that dissipates 2 W of power can weigh around just 0.2 kg.

However, although a reactive load represents the electrical response of a typical speaker better than a purely resistive load, the physical size and weight of a reactive load to dissipate a given amount of power is significantly greater than that for a purely resistive load to dissipate the same amount of power. For example, a reactive load may be two to four times the weight of a comparable purely resistive load.

In this example, the amplifier 205 is configured such that the reactive load 235 is only connected and driven when the amplifier 205 is in the low-power mode. Since the reactive load 235 is only driven in the low-power mode, the reactive load 235 can be relatively physically small and compact as it only has a relatively small amount of power to dissipate.

In this example, the amplifier 205 is configured to automatically switch to the low-power mode in response to the user selecting to use the reactive load 235 if the amplifier 205 is not already in the low-power mode (for example if the amplifier 205 is in the high-power mode or the sag mode). In this example, switches SW7 and SW8 in the amplifier 205 are switched together to select either the speaker 210 or the reactive load 235.

In this example, the amplifier 205 uses Dynamic Power Reduction (DPR)™ technology when switching from the high-power mode to the low-power mode. Reference is made in this respect to UK patent no. GB2446614B, the entire contents of which is incorporated herein by reference. Valve amplifiers are considered to sound at their best when they are turned up loud. This is because, at higher volume levels, the power valves V3, V4 introduce musical distortion and compression which are a defining part of the valve amplifier experience. DPR controls the output power level by dynamically adjusting the output stage voltages, allowing power valve V3, V4 distortion and compression at any volume level. However, the fact that valve amplifiers sound best when they are operated at full power means that they can be impractically loud. DPR can allow continuously variable power reduction, for example down to 10% of full power, such that the valve amplifier 205 can be used in any playing situation, including with the dummy load 235. However, DPR can also be used to switch between discrete power levels. In particular, in accordance with examples described herein, DPR can be used to switch between two power levels, namely for the high-power mode (for example, 50 W) and the low-power mode (for example, 2 W). Such switchable DPR can use similar components to continuously variable DPR, but can result in less complicated and lighter circuitry than continuously variable DPR, which can contribute to overall weight reduction in accordance with examples. DPR is a 'dynamic' circuit, delivering the exact compression, also known as sag, of a small overdriven valve amp, at any volume level. Unlike power attenuators, DPR places nothing between the output of the amplifier 205 and the speaker 210. Hence, as the power is reduced, the feel, tone and reliability of the amplifier 205 is maintained. DPR still drives the valves V1, V2, V3, V4 in the amplifier 205 in the low-power mode. As such, the amplifier 205 still provides the valve amplifier tone when using the reactive load 235. However, by leveraging DPR, the amplifier 205 can use a physically small and lightweight reactive load 235. In particular, by using the switchable DPR described above, as opposed to continuously variable DPR, a reactive load that is only able to dissipate the power of the low-power mode (for example, 2 W) can be used, as opposed to a reactive load that could dissipate power at levels between a maximum and a minimum power level. Again, this facilitates overall weight reduction. In addition, even though, as explained above, the sag resistor 230 can be automatically bypassed in the low-power mode, DPR can still provide a degree of sag.

The tone-generating parts in the preamp 220 and the power amp 225, including all of the valves V1, V2, V3, V4, are used whether the speaker 210 or the reactive load 235 is connected. As such, the valves V1, V2, V3, V4 can still be run without having the speaker 210 connected.

In this example, the amplifier 205 comprises a digital signal processing system comprising a digital signal processor (DSP) 240. The DSP 240 takes the same power amplifier output as the loudspeaker 210 and the reactive load 235.

In this example, the DSP 240 has speaker simulator functionality. In some examples, the DSP 240 applies speaker simulator processing for speaker equalisation (EQ) and room ambiance to reproduce the sound and feel of a mic'd-up speaker cabinet in high detail. In some examples, the DSP 240 can simulate a speaker cabinet and room with, effectively, zero latency, no phase mismatch and much more flexibility than an impulse response (IR) snapshot.

As will be explained in more detail below, the amplifier 205 can implement filtering when the power amp 225 drives the reactive load 235, whereby to match impedance and frequency response profiles of the reactive load 235 and the speaker 210. In this example, the amplifier 205 includes analogue filtering circuitry 245 to provide additional analogue filtering for the reactive load 235 in this regard.

In addition, the digital signal processing system can sample an output of the power amp 225 from either the reactive load 235 or the speaker 210 depending on the output mode (for example, non-silent or silent output mode). The digital signal processing system is also configured to implement digital signal processing on the sampled output to mimic one or more filter response characteristics of a loudspeaker cabinet and one or more reflection profiles of one or more listening environments. As such, an output of the digital signal processing system is matched whether the reactive load 235 or the speaker 210 is being driven.

The DSP 240 output may take various forms, including, but not limited to Universal Serial Bus (USB), XLR direct injection (DI) out, and headphones. With more musicians recording at home, the system 200 can, for example, provide USB audio connectivity for professional recording and XLR DI for professional live use. Both outputs can use the built-in reactive load 235 and the DSP speaker simulation.

In this example, the preamp 220, power amp 225, reactive load 235 and DSP 240 are all contained within one housing, as opposed to being in separate housings. In particular, since the reactive load 235 is relatively physically compact, it can be incorporated into the same housing as the preamp 220, power amp 225 and DSP 240. This may not be possible with physically larger dummy loads.

In this example, the switches SW3 to SW10 in the amplifier 205 are electronic switches. Examples of electronic switches include, but are not limited to, transistors, junction-gate field-effect transistors (JFETs) and metal-oxide-semiconductor field-effect transistors (MOSFETs). The switches work in specific combinations, all controlled via logic circuits. The switches SW3 to SW10 are all controlled depending on the various permutations of the two main front panel switches SW1, SW2 for standby and power level respectively.

The amplifier 205 may provide two channels. One channel may be for clean tones and the other may be for overdriven tones. The channels may be foot-switchable, being controlled using a foot controller.

As such, in examples, the amplifier 205 may be operated in high-power, sag, or low-power modes with the speaker 210 connected, or may be operated in the low-power mode with either the speaker 210 or the reactive load 235 connected. In examples, the example amplifier 205 may not be operated in the sag or high-power mode with the reactive load 235 connected.

In examples described above, circuitry for DPR-based power switching is provided outside the SMPS system 215, 230. In other examples, the SMPS system 215, 230 may perform such power switching. In particular, the SMPS may be operable in the high-power mode and the low-power mode, or the power amp 225 may be operable in the high-power mode and the low-power mode.

In examples described above, the amplifier 205 with the dummy load 235 is operable in high-power and low-power modes. Alternatively, an amplifier with a dummy load may be provided which is operable only in a low-power mode (for example, 2 W or 5 W). While such an amplifier would be able to use a relatively lightweight and physically compact dummy load, such a relatively low level of power would be insufficient for a loud live performance.

Additional circuitry of the amplifier 205 shown in FIG. 2 will now be described.

The power amp 225 comprises signal attenuation resistors 250, which are switched in when the amplifier 205 runs in the low-power mode. The power amp 225 also comprises an inverter 255, which provides signal inversion, as needed, for "push-pull" operation. The power amp 225 also comprises power amplifier control grid bias resistors 260.

The amplifier 205 comprises resistors 265 that adjust the bias voltage for switching between the low- and high-power modes. The amplifier 205 also comprises a resistor 270 that drops voltage to put the amplifier 205 in the low-power mode. An additional resistor and capacitors are coupled with the resistor 270 to provide power supply filtering. The amplifier 205 also comprises DSP signal attenuation resistors 275.

A summary of the switches SW1 to SW10 shown in FIG. 2 is now also provided. SW1 is a main power/standby switch. SW2 selects the full/low or sag power mode. SW3 attenuates the signal level entering the power amp 225 when the amplifier 205 is used in the low-power mode. This keeps the power amp 225 distortion (clipping) levels consistent between high- and low-power modes; the low-power mode needs less input signal to produce the same level of clipping. SW4 adjusts the output valve bias between low- and high-power modes. SW5 limits the voltage available to the power valve screen grid connection. When SW5 is closed, the amplifier 205 operates in high-power mode. When SW5 is open, the voltage that drops over the resistor 270 forces the amplifier 205 into the low-power mode. With SW6 closed, the amplifier 205 operates in the high-power mode. With SW6 open, the sag resistor 230 operates and drops voltage in the main HT supply which creates the power amp compression effect. SW7 and SW8 work to alternate between the main speaker load 210 and the reactive load 235. SW7 and SW8 are not both in the same position at the same time, so that only one of the loads (the main speaker load 210 or the reactive load 235) is used at a time. SW9 engages attenuation of the DSP send signal when the amplifier 205 is running in the high-power mode. SW10 bypasses the additional analogue filtering performed by the analogue filter 245 when the amplifier 205 is used with the speaker 210.

In some embodiments, a valve amplifier is therefore operable in a high-power mode and a low-power mode. The valve amplifier comprises a valve power amplifier and a loudspeaker simulator circuit. The valve amplifier is configured such that the valve power amplifier drives the loudspeaker simulator circuit in the low-power mode. Power switching, between the high- and low-power mode may be provided by an SMPS or by the valve power amp.

Figure 3:
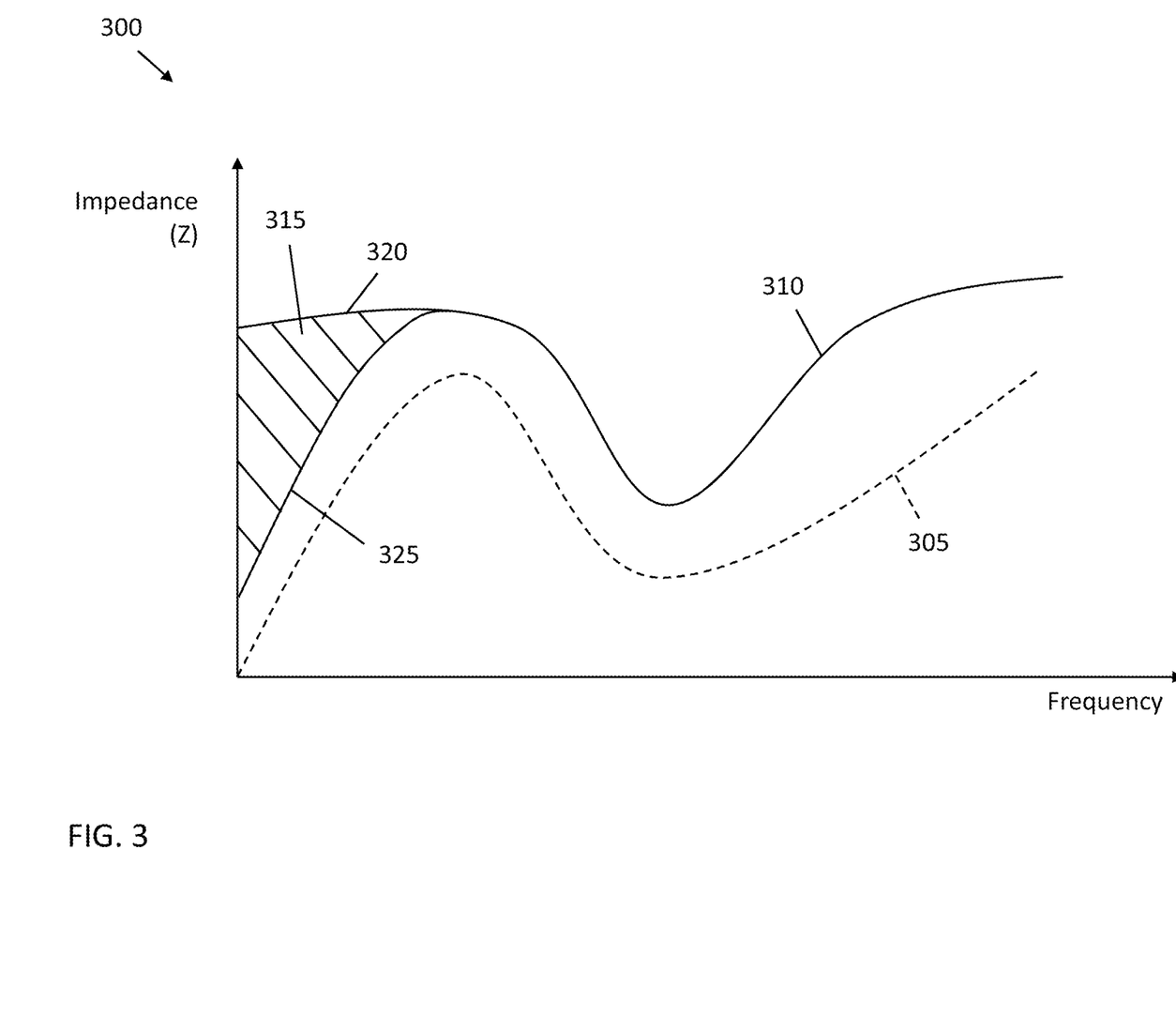
FIG. 3 shows a diagram with impedance across frequency plots.

Referring to FIG. 3, there is shown a diagram 300 with an example impedance across frequency plot 305 for a typical speaker (shown using broken lines in FIG. 3). There is also shown an example impedance profile 310 of a reactive load described herein (shown using a solid line in FIG. 3). There is also shown an area 315 which is affected by the additional analogue filtering that is added into the circuit, by being switched into the circuit, when the output signal of the amplifier is derived from the reactive load. Such additional filtering may be performed by the filtering component 245 described above. The frequency plot 310 of the example reactive load covers a larger integral area than that of the plot 305 of a typical speaker. This may be so that mainly subtractive filtering can be used when applying digital frequency correction. As such, the signal to noise ratio of the input is not further degraded; adding in any gain also adds noise. This also allows many different speaker impedance frequency profiles to be accommodated.

The sweep of the profile 310 of the reactive load does not have the same low frequency "bump" as the curve 305 of the typical speaker. The profile 310 of the reactive load is more of a slope down from DC. This is to accommodate speaker impedance sweeps which have a lower "resonant frequency" and is also a side effect of the reduced weight of the reactive load. To create the low frequency "bump", a large inductor and capacitor may be used, which are comparatively large compared to a smaller inductor that can simulate "voice coil" inductance, namely the slow rise in the higher frequencies. To reduce weight, the inductor may be removed and only a capacitor and resistor may be used. To create a more realistic frequency response to feed to the DSP 240, a second order high-pass filter is added to remove the area 315. This pushes the reactive load profile 310 (with the area 315 removed) much closer to the typical speaker profile 305. Portion 320 of the reactive load profile 310 is the portion that would be present without the area 315 being removed. Portion 325 of the reactive load profile 310 is the corresponding portion with the area 315 removed. By performing such filtering in the analogue domain, for example, using the filtering component 245, DSP processing power is also saved. On low-power DSP modules, additional filter stages consume a significant number of processing cycles.

What is claimed is:

1. A valve amplifier comprising:
   a valve power amplifier switchable between a high-power mode and a low-power mode; and
   a loudspeaker simulator circuit;
   wherein the valve amplifier is configured such that the valve power amplifier drives the loudspeaker simulator circuit in the low-power mode;
   and wherein a set of switches is configured to implement switching between the valve power amplifier driving the loudspeaker simulator circuit in a first output mode and the valve power amplifier driving a loudspeaker in a second output mode.

2. The valve amplifier according to claim 1, the valve amplifier being configured to implement filtering when the valve power amplifier drives the loudspeaker simulator circuit, whereby to match impedance and frequency response profiles of the loudspeaker simulator circuit and the loudspeaker.

3. The valve amplifier according to claim 1, comprising a digital signal processing system configured to:
   sample an output of the valve power amplifier from either the loudspeaker simulator circuit or the loudspeaker depending on the output mode; and
   implement digital signal processing on the sampled output to mimic one or more filter response characteristics of a loudspeaker cabinet and one or more reflection profiles of one or more listening environments, whereby to match an output of the digital signal processing system whether the loudspeaker simulator circuit or the loudspeaker is being driven.

4. The valve amplifier according to claim 1, wherein the loudspeaker has a modified ferrite magnet structure having a geometry that enables the loudspeaker to have a sensitivity of at least 98 dB (1 W at 1 m) while having less than 80 percent of a mass of an unmodified loudspeaker having a same sensitivity.

5. The valve amplifier according to claim 1, wherein the loudspeaker is comprised in a cabinet made of wood-based material having a density of less than 680 kilograms per cubic metre.

6. The valve amplifier according to claim 5, wherein the cabinet accentuates frequencies in the region of 300 Hz to 5 kHz and wherein the valve amplifier comprises an electronic cabinet filter configured to compensate for the accentuated frequencies.

7. The valve amplifier according to claim 1, comprising a switched-mode power supply (SMPS) system, the SMPS system comprising an SMPS.

8. The valve amplifier according to claim 7, wherein the SMPS system comprises circuitry configured to mimic one or more output impedance characteristics of a linear power supply and valve rectifier.

9. The valve amplifier according to claim 7, wherein the SMPS system comprises circuitry configured to enable an output impedance of the SMPS to be switched between first and second output impedances, the first output impedance being lower than the second output impedance.

10. The valve amplifier according to claim 1, wherein the loudspeaker simulator circuit comprises a resistive load.

11. The valve amplifier according to claim 1, wherein the loudspeaker simulator circuit comprises a reactive load.

12. A valve amplifier comprising:
    a valve power amplifier switchable between a high-power mode and a low-power mode; and
    a loudspeaker simulator circuit;
    wherein the valve amplifier is configured such that the valve power amplifier drives the loudspeaker simulator circuit in the low-power mode; and
    wherein the valve amplifier comprises a switched mode power supply (SMPS) system comprising an SMPS, the SMPS system comprising circuitry configured to mimic one or more output impedance characteristics of a linear power supply and valve rectifier.

13. The valve amplifier of claim 12, wherein the SMPS system comprises circuitry configured to enable an output impedance of the SMPS to be switched between first and second output impedances, the first output impedance being lower than the second output impedance.

14. The valve amplifier of claim 12, wherein a set of switches is configured to implement switching between the valve power amplifier driving the loudspeaker simulator circuit in a first output mode and the valve power amplifier driving a loudspeaker in a second output mode.

15. The valve amplifier of claim 14, further comprising a digital signal processing system configured to:

sample an output of the valve power amplifier from either the loudspeaker simulator circuit or the loudspeaker depending on the output mode; and implement digital signal processing on the sampled output to mimic one or more filter response characteristics of a loudspeaker cabinet and one or more reflection profiles of one or more listening environments, whereby to match an output of the digital signal processing system whether the loudspeaker simulator circuit or the loudspeaker is being driven.

16. The valve amplifier according to claim 12, wherein the valve amplifier is configured to implement filtering when the valve power amplifier drives the loudspeaker simulator circuit, whereby to match impedance and frequency response profiles of the loudspeaker simulator circuit and the loudspeaker.

17. The valve amplifier according to claim 12, wherein the loudspeaker has a modified ferrite magnet structure having a geometry that enables the loudspeaker to have a sensitivity of at least 98 dB (1 W at 1 m) while having less than 80 percent of a mass of an unmodified loudspeaker having a same sensitivity.

* * * * *